US011862421B1

(12) United States Patent
Wu et al.

(10) Patent No.: US 11,862,421 B1
(45) Date of Patent: Jan. 2, 2024

(54) TRIM CIRCUIT FOR E-FUSE

(71) Applicant: UNITED MICROELECTRONICS CORP., Hsinchu (TW)

(72) Inventors: Yang-Ling Wu, Taichung (TW); Chung-Yuan Lee, Hsinchu (TW); Chun-Liang Hu, Hsinchu (TW); Chih-Yung Kang, Taipei (TW); Shih-Hsiung Chiu, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 77 days.

(21) Appl. No.: 17/851,592

(22) Filed: Jun. 28, 2022

(30) Foreign Application Priority Data

May 25, 2022 (TW) .................................. 111119511

(51) Int. Cl.
*H01H 37/76* (2006.01)
*H01H 37/00* (2006.01)

(52) U.S. Cl.
CPC .......... *H01H 37/76* (2013.01); *H01H 37/002* (2013.01)

(58) Field of Classification Search
CPC ...................................................... H01H 37/76
USPC .......................................................... 327/525
See application file for complete search history.

(56) References Cited

U.S. PATENT DOCUMENTS

| 4,873,673 | A | 10/1989 | Hori |
| 5,610,486 | A | 3/1997 | Li |
| 5,889,431 | A | 3/1999 | Csanky |
| 6,177,817 | B1 | 1/2001 | Fifield |
| 6,924,601 | B2 * | 8/2005 | Date ........................ G09G 3/20 345/98 |

* cited by examiner

*Primary Examiner* — Tomi Skibinski
(74) *Attorney, Agent, or Firm* — WPAT, P.C

(57) ABSTRACT

A trim circuit for an e-fuse unit includes: a mirroring circuit for receiving an enable signal, when triggered by the enable signal, the mirroring circuit generating a driving voltage; and a driving transistor coupled to the mirroring circuit, in response to the driving voltage from the mirroring circuit, the driving transistor turning ON to generate a MOS current to an output node, wherein the output node is coupled to the e-fuse unit, and in response to the MOS current from the output node, the e-fuse unit is burned out.

8 Claims, 2 Drawing Sheets

TRIM CIRCUIT FOR E-FUSE

This application claims the benefit of Taiwan application Serial No. 111119511, filed May 25, 2022, the disclosure of which is incorporated by reference herein in its entirety.

TECHNICAL FIELD

The disclosure relates in general to a trim circuit for an e-fuse unit.

BACKGROUND

E-fuse unit can be used in many semiconductor application fields, such as memory device or programmable logic device. The e-fuse unit has an intact state and a melted state. If the e-fuse unit is melted, the e-fuse unit will have a higher resistance; otherwise, the e-fuse unit will have a lower resistance. That is, the e-fuse unit may present a high impedance state (melted) or a low impedance state (not melted). When the trim circuit for an e-fuse unit transmits a melting current to the e-fuse unit, the e-fuse unit will be melted.

In terms of the current situations, the trim circuit for an e-fuse unit occupies a large circuit area, but cannot operate normally when one of the elements is damaged.

Therefore, it has become a prominent for the industries to provide an improved trim circuit for an e-fuse unit, which occupies a smaller circuit area and is still able to melt even when one of the elements is damaged.

SUMMARY

According to one embodiment, a trim circuit for an e-fuse unit is provided. The trim circuit for an e-fuse unit includes a mirroring device for receiving an enable signal and a driving transistor coupled to the mirroring device. When the mirroring device is triggered by the enable signal, the mirroring device generates a driving voltage. In response to the driving voltage generated by the mirroring device, the driving transistor is turned on to generate an MOS current to an output node coupled to the e-fuse unit. In response to the MOS current transmitted from the output node, the e-fuse unit is melted to a high impedance state.

The above and other aspects of the invention will become better understood with regard to the following detailed description of the preferred but non-limiting embodiment(s). The following description is made with reference to the accompanying drawings.

Figure 1:
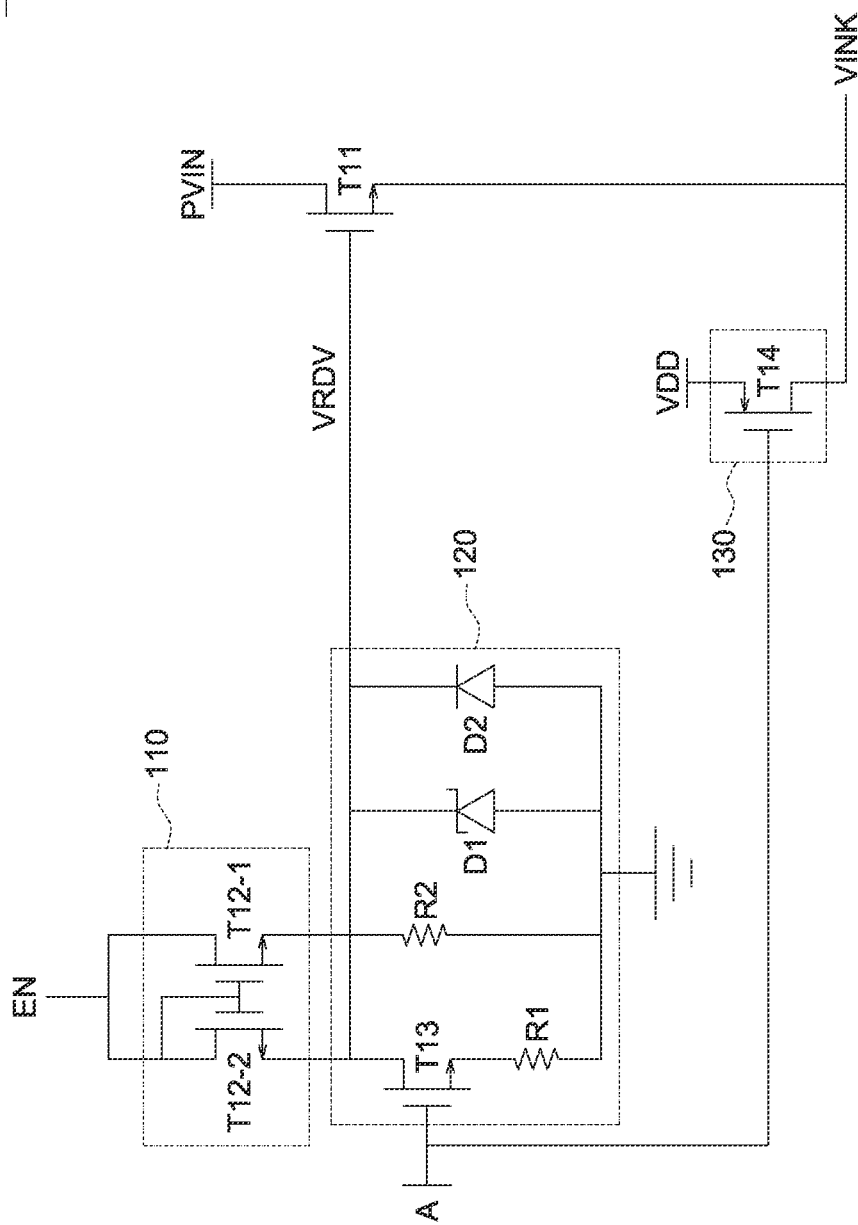
FIG. 1 is a circuit diagram of a trim circuit for an e-fuse unit according to an embodiment of the present application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The trim circuit for an e-fuse unit according to an embodiment of the present application turns on the driving transistor with a mirroring device (can be realized by a current mirror but is not limited thereto) to melt the e-fuse unit.

FIG. 1 is a circuit diagram of a trim circuit for an e-fuse unit according to an embodiment of the present application. As indicated in FIG. 1, the trim circuit for an e-fuse unit 100 according to an embodiment of the present application includes a mirroring device 110 and a driving transistor T11. The mirroring device 110 can be realized by a current mirror but is not limited thereto. The trim circuit for an e-fuse unit 100 further selectively includes a protection circuit 120 and a current prohibition circuit 130.

The mirroring device 110 receives an enable signal EN. When the mirroring device 110 is triggered by the enable signal EN, the mirroring device 110 generates a driving voltage VDRV at logic high level to the driving transistor T11.

In a possible example of the present application, the mirroring device 110 includes a first transistor T12-1 and a second transistor T12-2 coupled to each other. The first transistor T12-1 conducts a current and generates the driving voltage VDRV. The second transistor T12-2 mirrors the current of the first transistor T12-1.

Each of the first transistor T12-1 and the second transistor T12-2 can be realized by an NMOS transistor but is not limited thereto. The first transistor T12-1 has a first terminal for receiving the enable signal EN, a second terminal coupled to the protection circuit 120, and a control terminal coupled to the control terminal of the second transistor T12-2. The first terminal can be realized by a drain terminal but is not limited thereto. The second terminal can be realized by a source terminal but is not limited thereto. The control terminal can be realized by a gate end but is not limited thereto.

The second transistor T12-2 has a first terminal for receiving the enable signal EN, a second terminal coupled to the protection circuit 120, and a control terminal coupled to the control terminal of the first transistor T12-1 and the first terminal of the second transistor T12-2. The first terminal can be realized by but is not limited thereto a drain terminal. The second terminal can be realized by a source terminal but is not limited thereto. The control terminal can be realized by a gate end but is not limited thereto.

The driving transistor T11 is coupled to the mirroring device 110. When the mirroring device 110 generates a driving voltage VDRV at logic high level to the gate of the driving transistor T11, the driving transistor T11 is turned on to generate an MOS current to the output node VINK. The output node VINK is further coupled to the e-fuse unit (not illustrated). In response to the MOS current transmitted from the output node VINK, the e-fuse unit is melted to a high impedance state.

The driving transistor T11 can be realized by an NMOS transistor but is not limited thereto. The driving transistor T11 has a first terminal for receiving an input voltage PVIN, a second terminal coupled to the output node VINK, and a control terminal for receiving the driving voltage VDRV generated by the mirroring device 110. The first terminal can be realized by a drain terminal but is not limited thereto. The second terminal can be realized by a source terminal but is not limited thereto. The control terminal can be realized by a gate end but is not limited thereto.

The protection circuit 120 is coupled to the driving transistor T11 and the mirroring device 110. The protection circuit 120 adjusts the driving voltage VDRV provided to the driving transistor T11 to protect the mirroring device 110 and provides a bias voltage to the mirroring device 110.

The protection circuit 120 includes a third transistor T13 coupled to the mirroring device 110, a first diode D1 coupled to the mirroring device 110, and a second diode D2 coupled to the mirroring device 110. The third transistor T13 biases the mirroring device 110. The first diode D1 provides a reverse bias protection to the mirroring device 110. The second diode D2 provides a forward bias protection to the mirroring device 110. The first diode D1 can be realized by a Zener diode but is not limited thereto. The second diode D2 can be realized by a PN junction diode but is not limited thereto.

The third transistor T13 further receives a control signal A. When the third transistor T13 is controlled by the control signal A, the third transistor T13 is turned on to provide a bias voltage to the mirroring device 110.

The third transistor T13 can be realized by an NMOS transistor but is not limited thereto. The third transistor T13 has a first terminal coupled to the second terminal of the second transistor T12-2, a second terminal coupled to the first resistor R1, and a control terminal for receiving the control signal A. The first terminal can be realized by a drain terminal but is not limited thereto. The second terminal can be realized by a source terminal but is not limited thereto. The control terminal can be realized by a gate end but is not limited thereto.

The first diode D1 is coupled between the driving voltage VDRV and the ground terminal. The second diode D2 is also coupled between the driving voltage VDRV and the ground terminal. The first diode D1 and the second diode D2 are connected in parallel.

Additionally, the protection circuit 120 further selectively includes a first resistor R1 and a second resistor R2. The first resistor R1 is coupled between the second terminal of the third transistor T13 and the ground terminal. The second resistor R2 is coupled between the second terminal of the first transistor T12-1 and the ground terminal. The first resistor R1 and the second resistor R2 can be used to step down the voltage to avoid the mirroring device 110 being burning out by an overcurrent.

The current prohibition circuit 130 is coupled to the output node VINK to prohibit the MOS current generated by the driving transistor T11 flowing to the protection circuit 120. When the current prohibition circuit 130 is controlled by the control signal A, the current prohibition circuit 130 is turned off to prohibit the MOS current generated by the driving transistor T11 flowing to the protection circuit 120.

The current prohibition circuit 130 can be realized by a transistor T14 but is not limited thereto. Exemplarily but not restrictively, the transistor T14 is a PMOS transistor. The transistor T14 includes a first terminal coupled to the power source VDD, a second terminal coupled to the output node VINK, and a control terminal for receiving the control signal A. The first terminal can be realized by a source terminal but is not limited thereto. The second terminal can be realized by a drain terminal but is not limited thereto. The control terminal can be realized by a gate end but is not limited thereto.

Figure 2:
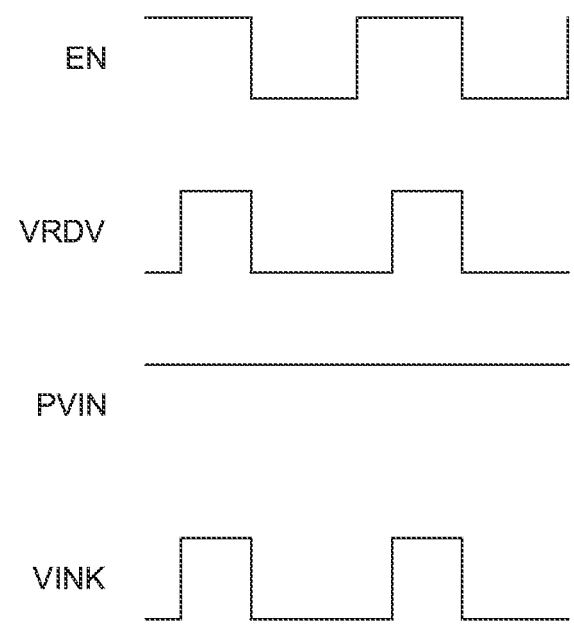
FIG. 2 is a signal waveform diagram of a trim circuit for an e-fuse unit according to an embodiment of the present application.

FIG. 2 is a signal waveform diagram of a trim circuit for an e-fuse unit according to an embodiment of the present application. As indicated in FIG. 2, when the enable signal EN is at logic high level, the mirroring device generates a driving voltage VDRV at logic high level to the driving transistor T11. In response to the driving voltage VDRV at logic high level, the driving transistor T11 is turned on (the voltage of the output node VINK is equivalent to the input voltage PVIN) to generate an MOS current and provide a voltage at logic high level to the output node VINK. In response to the MOS current and the voltage at logic high level, the e-fuse unit is melted at the output node VINK.

As disclosed above, by using a mirroring device, the circuit area of the trim circuit for an e-fuse unit an embodiment of the present application can be reduced in comparison to the prior art.

As disclosed above, by using a mirroring device, the trim circuit for an e-fuse unit according to an embodiment of the present application can operate normally even when one of the transistors of the mirroring device breaks down, so that normal operations of the circuit can be assured.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A trim circuit for an e-fuse unit, comprising:
   a mirroring device for receiving an enable signal, wherein when the mirroring device is triggered by the enable signal, the mirroring device generates a driving voltage; and
   a driving transistor coupled to the mirroring device, wherein in response to the driving voltage generated by the mirroring device, the driving transistor is turned on to generate an MOS current to an output node,
   wherein,
   the output node is further coupled to the e-fuse unit,
   in response to the MOS current transmitted from the output node, the e-fuse unit is melted to a high impedance state.

2. The trim circuit for an e-fuse unit according to claim 1, wherein, the mirroring device comprises a first transistor and a second transistor coupled to each other; the first transistor turns on a current and generates the driving voltage; and the second transistor mirrors the current of the first transistor.

3. The trim circuit for an e-fuse unit according to claim 1, further comprising a protection circuit coupled to the driving transistor and the mirroring device, wherein the protection circuit adjusts the driving voltage provided to the driving transistor to protect the mirroring device and provides a bias voltage to the mirroring device.

4. The trim circuit for an e-fuse unit according to claim 3, wherein, the protection circuit comprises:
   a third transistor coupled to the mirroring device to bias the mirroring device;
   a first diode coupled to the mirroring device to provide a reverse bias protection to the mirroring device; and,
   a second diode coupled to the mirroring device to provide a forward bias protection to the mirroring device.

5. The trim circuit for an e-fuse unit according to claim 4, wherein, the third transistor further receives a control signal; when the third transistor is controlled by the control signal, the third transistor is turned on to provide a bias voltage to the mirroring device.

6. The trim circuit for an e-fuse unit according to claim 4, wherein, the first diode is a Zener diode, and the second diode is a PN junction diode.

7. The trim circuit for an e-fuse unit according to claim 4, further comprising: a current prohibition circuit coupled to the output node to prohibit the MOS current generated by the driving transistor flowing to the protection circuit.

8. The trim circuit for an e-fuse unit according to claim 7, wherein, the current prohibition circuit further receives the control signal; when the current prohibition circuit is controlled by the control signal, the current prohibition circuit is turned off to prohibit the MOS current generated by the driving transistor flowing to the protection circuit.

* * * * *